United States Patent
Norimatsu

(10) Patent No.: US 10,498,562 B2
(45) Date of Patent: Dec. 3, 2019

(54) ELECTRIC SIGNAL TRANSMISSION DEVICE

(71) Applicant: Hitachi, Ltd., Chiyoda-ku, Tokyo (JP)

(72) Inventor: Takayasu Norimatsu, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/090,913

(22) PCT Filed: Apr. 8, 2016

(86) PCT No.: PCT/JP2016/061472
§ 371 (c)(1),
(2) Date: Oct. 3, 2018

(87) PCT Pub. No.: WO2017/175365
PCT Pub. Date: Oct. 12, 2017

(65) Prior Publication Data
US 2019/0109735 A1    Apr. 11, 2019

(51) Int. Cl.
*H04L 25/03* (2006.01)
*H04L 25/49* (2006.01)
*H03L 7/08* (2006.01)
*H03L 7/081* (2006.01)

(52) U.S. Cl.
CPC ........ *H04L 25/03019* (2013.01); *H03L 7/081* (2013.01); *H03L 7/0807* (2013.01); *H04L 25/49* (2013.01)

(58) Field of Classification Search
None
See application file for complete search history.

(56) References Cited

U.S. PATENT DOCUMENTS

| 5,450,452 A * | 9/1995 | Kakuishi ............... H03D 3/241 327/159 |
| 6,888,899 B2 * | 5/2005 | Raleigh ............... H04B 7/0615 375/296 |

(Continued)

FOREIGN PATENT DOCUMENTS

| JP | 2014-33347 A | 2/2014 |
| JP | 2014-204234 A | 10/2014 |

(Continued)

OTHER PUBLICATIONS

International Search Report (PCT/ISA/210) issued in PCT Application No. PCT/JP2016/061472 dated Jun. 28, 2016 with English translation (two (2) pages).

(Continued)

*Primary Examiner* — Berhanu Tadese
(74) *Attorney, Agent, or Firm* — Crowell & Moring LLP

(57) ABSTRACT

Provided is an electric signal transmission device which corrects a data error caused by data transition in a pulse amplitude modulation signal to increase an EYE width. The electric signal transmission device can operate as follows: A data pattern determined by an equalizer and a phase relationship between data and a clock detected by a phase detector are used to calculate a correction amount according to the data pattern and the phase relationship, and the received data is corrected to a correct value by adding a correction amount in a data transition direction.

5 Claims, 17 Drawing Sheets

(56) References Cited

U.S. PATENT DOCUMENTS

| | | | | |
|---|---|---|---|---|
| 7,145,971 | B2* | 12/2006 | Raleigh | H04B 7/0615 375/347 |
| 7,199,956 | B1* | 4/2007 | Moser | G11B 5/59666 360/32 |
| 7,203,249 | B2* | 4/2007 | Raleigh | H04B 7/0615 375/260 |
| 7,555,060 | B2* | 6/2009 | Raleigh | H04B 7/0615 375/260 |
| 7,664,188 | B2* | 2/2010 | Raleigh | H04B 7/0615 375/260 |
| 7,738,602 | B2* | 6/2010 | Langenbach | H04L 25/03197 375/341 |
| 7,961,831 | B2* | 6/2011 | Ran | H04L 1/205 375/355 |
| 8,036,307 | B2* | 10/2011 | Raleigh | H04B 7/0615 375/299 |
| 8,442,152 | B2* | 5/2013 | Raleigh | H04B 7/0615 370/208 |
| 8,755,458 | B2* | 6/2014 | Raleigh | H04B 7/0615 370/208 |
| 8,791,735 | B1* | 7/2014 | Shibasaki | H03L 7/0812 327/147 |
| 9,184,820 | B2* | 11/2015 | Raleigh | H04B 7/0615 |
| 9,337,993 | B1* | 5/2016 | Lugthart | H04L 7/033 |
| 9,379,878 | B1* | 6/2016 | Lugthart | H04L 7/033 |
| 9,438,460 | B2* | 9/2016 | Ling | H04B 10/50 |
| 9,571,308 | B1* | 2/2017 | Lugthart | H04L 7/033 |
| 9,722,722 | B2* | 8/2017 | Way | H04J 14/0221 |
| 9,742,550 | B1* | 8/2017 | Lugthart | H04L 7/033 |
| 9,742,689 | B1* | 8/2017 | Wang | H04L 7/033 |
| 9,882,706 | B1* | 1/2018 | Lugthart | H04L 7/033 |
| 10,009,195 | B2* | 6/2018 | Pham | H04L 25/03044 |
| 10,148,414 | B2* | 12/2018 | Lugthart | H04L 7/033 |
| 2006/0274861 | A1* | 12/2006 | Langenbach | H04L 25/03197 375/341 |
| 2008/0056342 | A1* | 3/2008 | Fujuda | G11B 20/10009 375/231 |
| 2008/0240319 | A1* | 10/2008 | Ran | H04L 1/205 375/355 |
| 2008/0240653 | A1* | 10/2008 | King | G02B 6/14 385/28 |
| 2010/0329327 | A1* | 12/2010 | Kato | H04L 25/03038 375/233 |
| 2012/0133414 | A1* | 5/2012 | Zhuang | H03K 3/356113 327/333 |
| 2014/0093014 | A1* | 4/2014 | Wei | H04B 1/16 375/316 |
| 2016/0087747 | A1* | 3/2016 | Way | H04J 14/0221 398/81 |
| 2017/0019275 | A1* | 1/2017 | Norimatsu | H04L 25/03 |
| 2017/0257168 | A1* | 9/2017 | Gopalakrishnan | H04L 25/49 |
| 2017/0302431 | A1* | 10/2017 | Lugthart | H04L 7/033 |
| 2017/0366375 | A1* | 12/2017 | Pham | H04L 25/03044 |
| 2018/0351770 | A1* | 12/2018 | Chiu | H04L 25/03031 |
| 2019/0109735 | A1* | 4/2019 | Norimatsu | H04L 25/02 |

FOREIGN PATENT DOCUMENTS

| | | | | |
|---|---|---|---|---|
| WO | WO 2015/125282 A1 | 8/2015 | | |
| WO | WO-2017175365 A1 * | 10/2017 | | H04L 25/02 |

OTHER PUBLICATIONS

Japanese-language Written Opinion (PCT/ISA/237) issued in PCT Application No. PCT/JP2016/061472 dated Jun. 28, 2016 (three (3) pages).

Lee et al., "56Gb/s PAM4 and NRZ SerDes Transceivers in 40nm CMOS", Symposium on VLSI Circuits Digest of Technical Papers, Jun. 2015, pp. 118-119, Taipei, TW, (two (2) pages).

* cited by examiner

ELECTRIC SIGNAL TRANSMISSION DEVICE

TECHNICAL FIELD

The present invention relates to a receiver for high-speed wired transmission and a semiconductor integrated circuit usable for the receiver, and more particularly to a technique for correcting a signal error.

BACKGROUND ART

In recent years, attention has been focused on the use of big data, and traffic volume and data processing volume in data centers are increasing. Correspondingly, the data volumes and the processing capabilities of information communication devices are increasing. At that time, the communication speeds inside and outside the devices which are a bottleneck of large-scale data processing are also improving. For example, in communication outside the device, a transmission rate of 56 Gbps per channel is being standardized.

It is thought that communication is made difficult with a conventional non return to zero (NRZ) modulated signal because high-speed communication causes an increase in transmission loss in a communication path and 1 unit interval (UI) width of data is reduced. As described above, there is a limit to high-speed communication in a time direction, and it has been proposed to use pulse amplitude modulation-4 (PAM) which is a type of multi-level modulation, for a generation of 56 Gbps transmission rate per channel (see NPL 1).

CITATION LIST

Non Patent Literature

NPL 1: Jri Lee and et. Al., "56 Gb/s PAM 4 and NRZ SerDes Transceivers in 40 nm CMOS", 2015 Symposium on VLSI Circuits, pp. 118-119, June 2015

SUMMARY OF INVENTION

Technical Problem

In signal transmission using a PAM modulated signal, the number of data transition patterns increases compared with that in signal transmission using an NRZ modulated signal. Therefore, a phenomenon is seen in which an EYE width narrows in data transition pattern which would not be a problem in the NRZ modulated signal. For example, a time required for transition from −1 to +1 and a time required for transition from −3 to +3 are different, and the time required for transition from −3 to +3 has an increased transition time due to the increase of voltage change. For this reason, the EYE width tends to be narrow in a data pattern requiring a long time for data transition. These effects have influences independently of inter symbol interference (ISI), which has become a problem, and cannot be cancelled with filters, such as feed forward equalizer (FFE), continuous-time linear equalizer (CTLE), and decision feedback equalizer (DFE).

Therefore, in the present invention, it is an object to suppress a reduction of an EYE width due to change of transition time caused by a data pattern.

Solution to Problem

As means for solving the above problems, the present invention has the following features.

The present invention relates to a receiver having a data pattern correcting unit for suppressing EYE width reduction even though a transition time varies depending on input data patterns.

Although the transition time varies depending on the data input patterns and the EYE width is reduced, conversely, it can be said that there are patterns of data errors depending on data patterns. For example, when timing of fetching data is delayed in data transition, −3→+3, the data is incorrectly changed, for example, −1→+3. That is, it is uniformly determined how an error highly probably occurs depending on a data pattern and data capturing timing. For this reason, it is possible to correct data by extracting a data pattern on the basis of received data in which an error remains and applying a correction signal to the received signal according to a phase in the data pattern extraction.

Advantageous Effects of Invention

It is possible to suppress the reduction of the EYE width caused by the data pattern to suppress a bit error rate.

DESCRIPTION OF EMBODIMENTS

Details will be described below with reference to the drawings.

Figure 1:
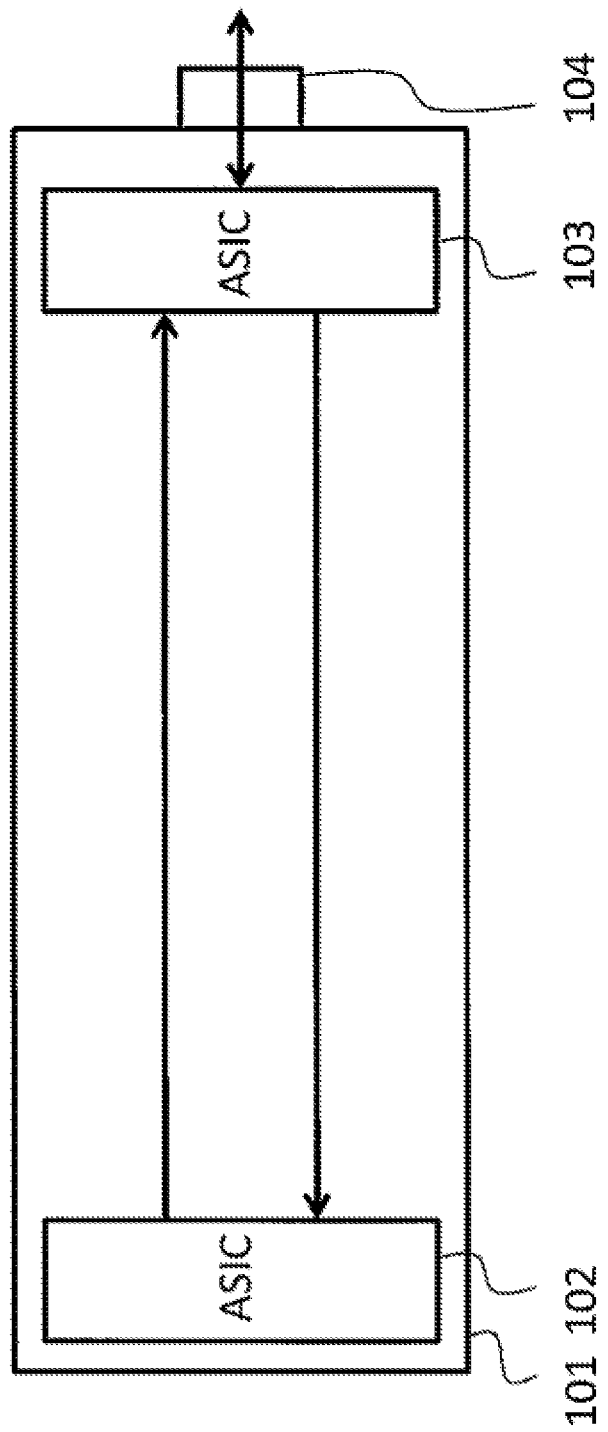
FIG. 1 is a diagram illustrating an electric signal transmission device on a single board.

FIG. 1 illustrates one aspect of wired transmission, exemplifying wired transmission on a single board. A signal processing ASIC 102 having a waveform equalization function, a communication ASIC 103 having a waveform equalization function, and a connector 104 are mounted on the board 101, and the ASIC 102 and the ASIC 103 communicate with each other, and the ASIC 103 communicates with another device through the connector 104.

Figure 2:
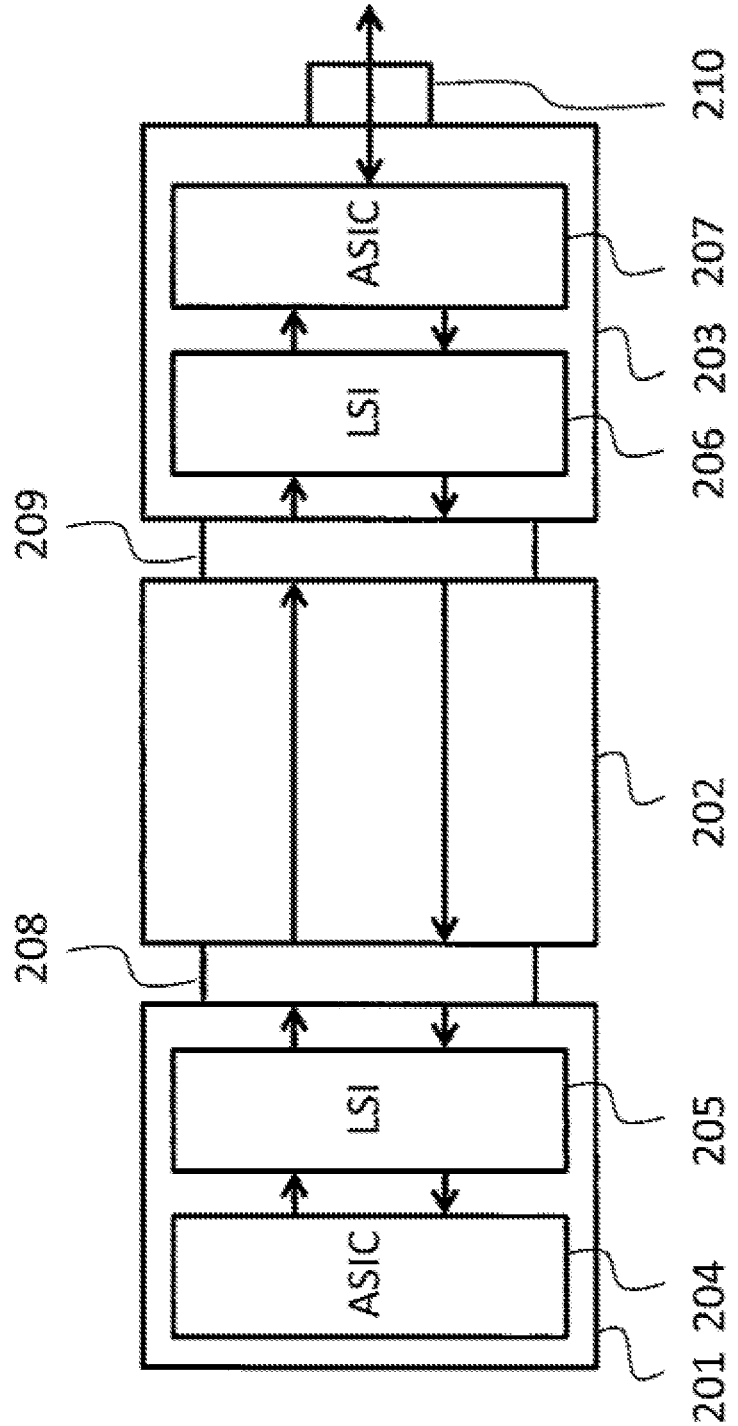
FIG. 2 is a diagram illustrating an electric signal transmission device when repeaters are used between a plurality of boards.

FIG. 2 illustrates an example in which the communication of FIG. 1 is performed not on a single board but on different boards via a transmission line, and a repeater is mounted on each of the boards. In the device, a board 201 on which a signal processing ASIC 204 and a repeater 205 are mounted is connected to a transmission line 202 via a connector 208, and a transmission line 202 is connected to a board 203 on which, a repeater 206, a communication ASIC 207, and a connector 210 are mounted, via a connector 209. The transmission line 202 may be a board or a cable. As in the signal flow of FIG. 1, the signal processing ASIC 204 communicates with another device connected to the connector 210 via the communication ASIC 207. A signal output from the ASIC 204 is relayed by the repeater 205, passed through the connector 208, the transmission line 202 and the connector 209, further relayed by the repeater 206, sent to the communication ASIC 207, and transmitted to an external device through the connector 210. Conversely, a signal received by the ASIC 207 from the external device through the connector 210 is sent to the repeater 206 and relayed, passed through the connector 209, the transmission line 202, and the connector 208, is relayed by the repeater 205, and received by the ASIC 204.

Figure 3:
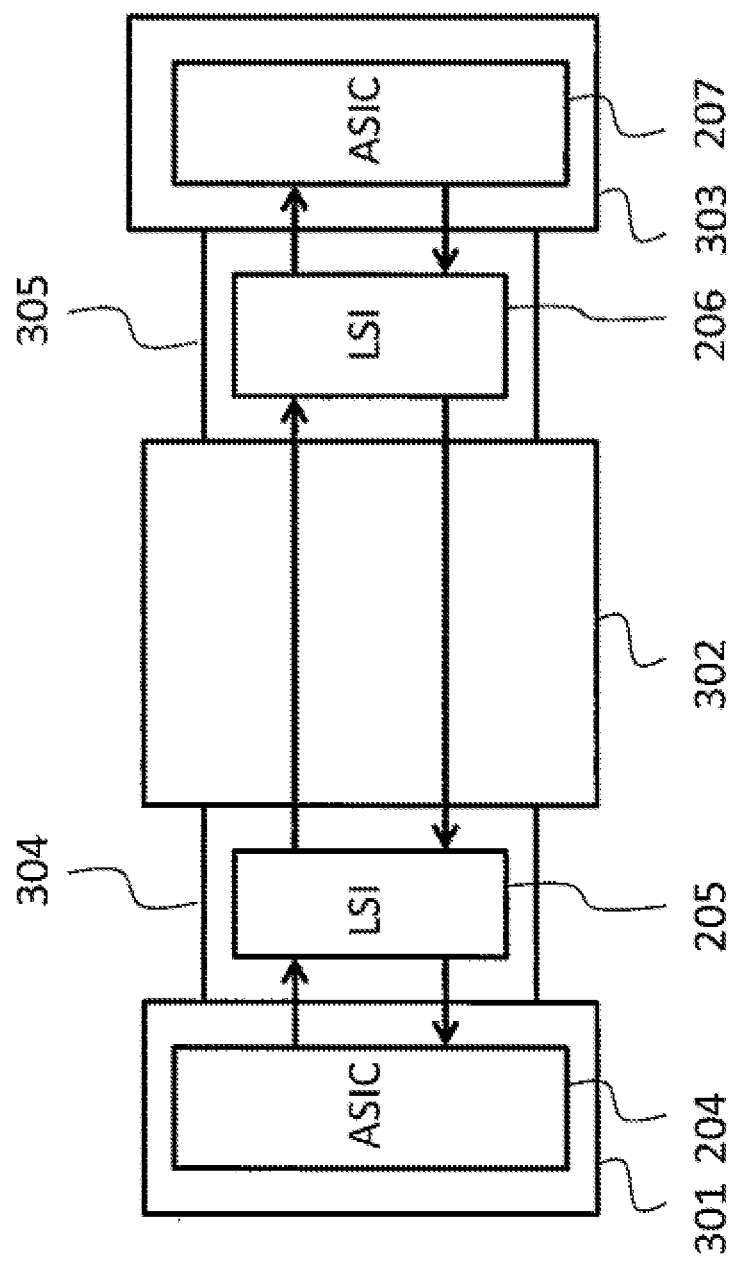
FIG. 3 is a diagram illustrating an electric signal transmission device when repeaters are mounted on connectors.

FIG. 3 illustrates an example in which the repeaters 205 and 206 of FIG. 2 are positioned in connectors 304 and 305. The ASIC 204 mounted on a board 301 and the ASIC 207 mounted on a board 303 communicate with each other via the repeater 205 and the repeater 206. The repeater 205 mounted on the connector 304 communicates with the repeater 206 mounted on the connector 305 via a transmission line 302.

Figure 4:
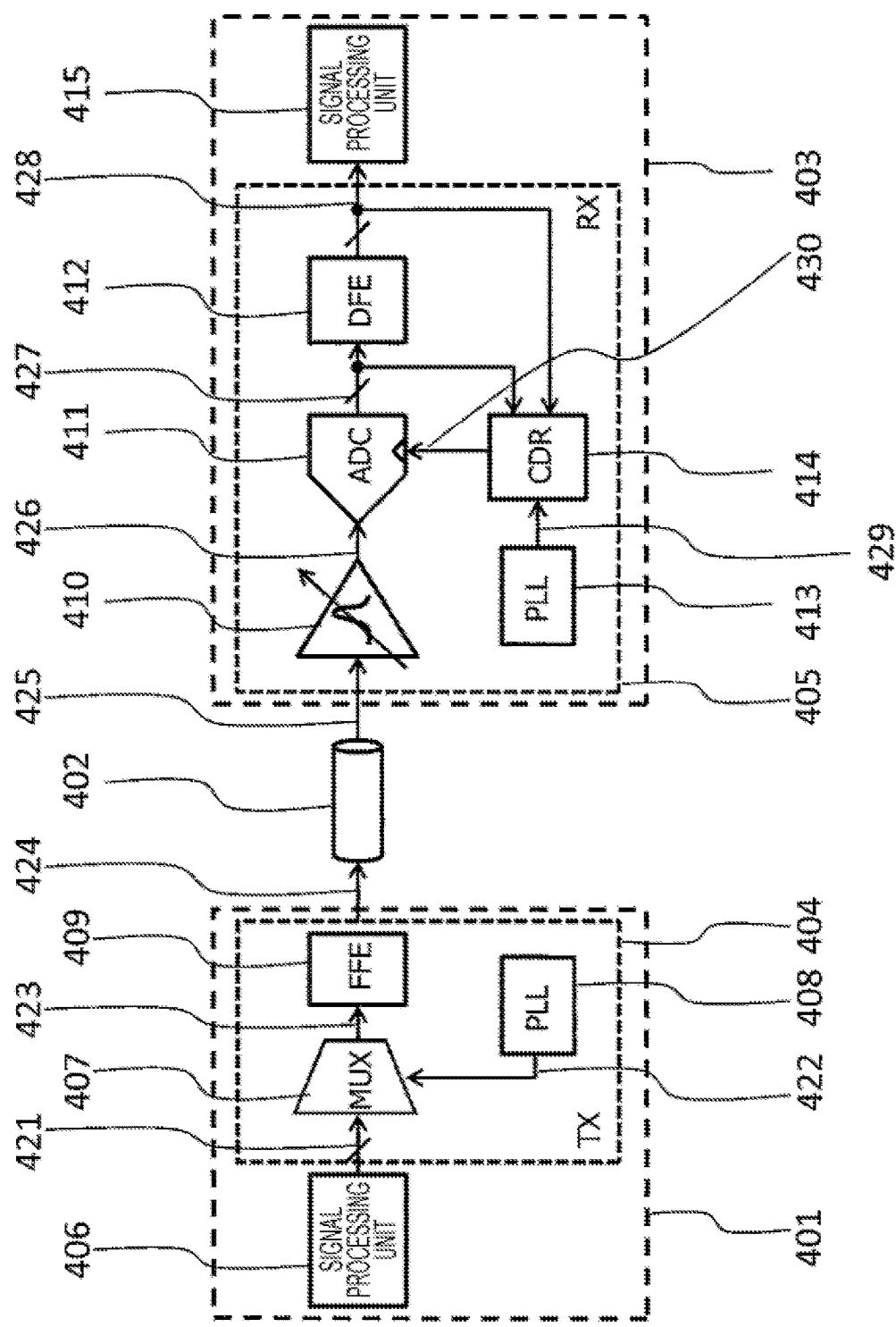
FIG. 4 is a diagram illustrating a transceiver for multilevel transmission used in an electric signal transmission device.

FIG. 4 is a diagram illustrating only the transmitter and the receiver that perform waveform equalization of the ASIC 102, the ASIC 103, the ASIC 204, the repeater 205, the repeater 206, and the ASIC 206 illustrated in FIGS. 1 to 3. FIG. 4 is a schematic diagram in which a signal is transmitted from a semiconductor 401 and a semiconductor 403 receives the signal through a transmission line 402. A transmitter 404 in the semiconductor 401 includes a feed forward equalizer (FFE) 409, a multiplexer 407, and a phase locked loop (PLL) 408. A receiver 405 in the semiconductor 403 includes a continuous time linear equalizer (CTLE) 410, an analog to digital converter (ADC) 411, a decision feedback equalizer (DFE) 412, a PLL 413, and a clock and data recovery (CDR) 414.

Next, a signal flow in the transmitter 404 will be described. The transmitter 404 receives a data signal 421 from a signal processing unit 406, and the data signal 421, which is transmitted in parallel, is converted in synchronization with a clock 422 from the PLL 408 in the multiplexer 407, and transmitted in serial. A waveform of the data signal 423 output from the multiplexer 407 is equalized so as to reduce the gain on the low-frequency side in the FFE 409, and an output signal 424 is output to the transmission line 402. A signal 425 passing through the transmission line 402 is transmitted to the receiving unit 405 in the semiconductor 403.

Next, a signal flow in the receiver 405 will be described. The data signal 424 output from the transmitter 404 attenuates through the transmission line 402, the CTLE 410 amplifies and equalizes the high-frequency side of the data signal 424 to obtain an equalized signal 426, and the equalized signal 426 is output to the ADC 411. In the ADC 411, the signal 426 amplified by the CTLE 410 is sampled by the CDR 414 in synchronization with a clock 430 obtained by adjusting the phase of an output clock 429 from the PLL 413, and converted into a digital signal 427. The output 427 from the ADC 411 is output to the DFE 412. In the DFE 412, the output 427 of the ADC 411 is filtered so as to be attenuated on the low-frequency side and amplified on the high-frequency side, and determined to have four values in the case of the PAM-4. receiver output data 428 determined to have four values is input to a signal processing unit 415 and the CDR 414. In the CDR 414, the phase of the output PLL output clock 429 is adjusted on the basis of the ADC output data 427 and the DFE output data 428 so that the data can be taken at a point where the EYE is most open. In addition, the signal processing unit 415 sends the receiver output data 428 to the transmitter, and is transmitted from the transmitter to the transmission line, and the data signal is relayed.

A conventional transceiver used also for the NRZ signal illustrated in FIG. 4 has three equalizers of the FFE, CTLE, and DFE, but although these three equalizers are effective for ISI, the EYE width reduction due to a difference in data transition time cannot be corrected. The EYE width reduction due to the data transition time will be described with reference to FIG. 5.

Figure 5:
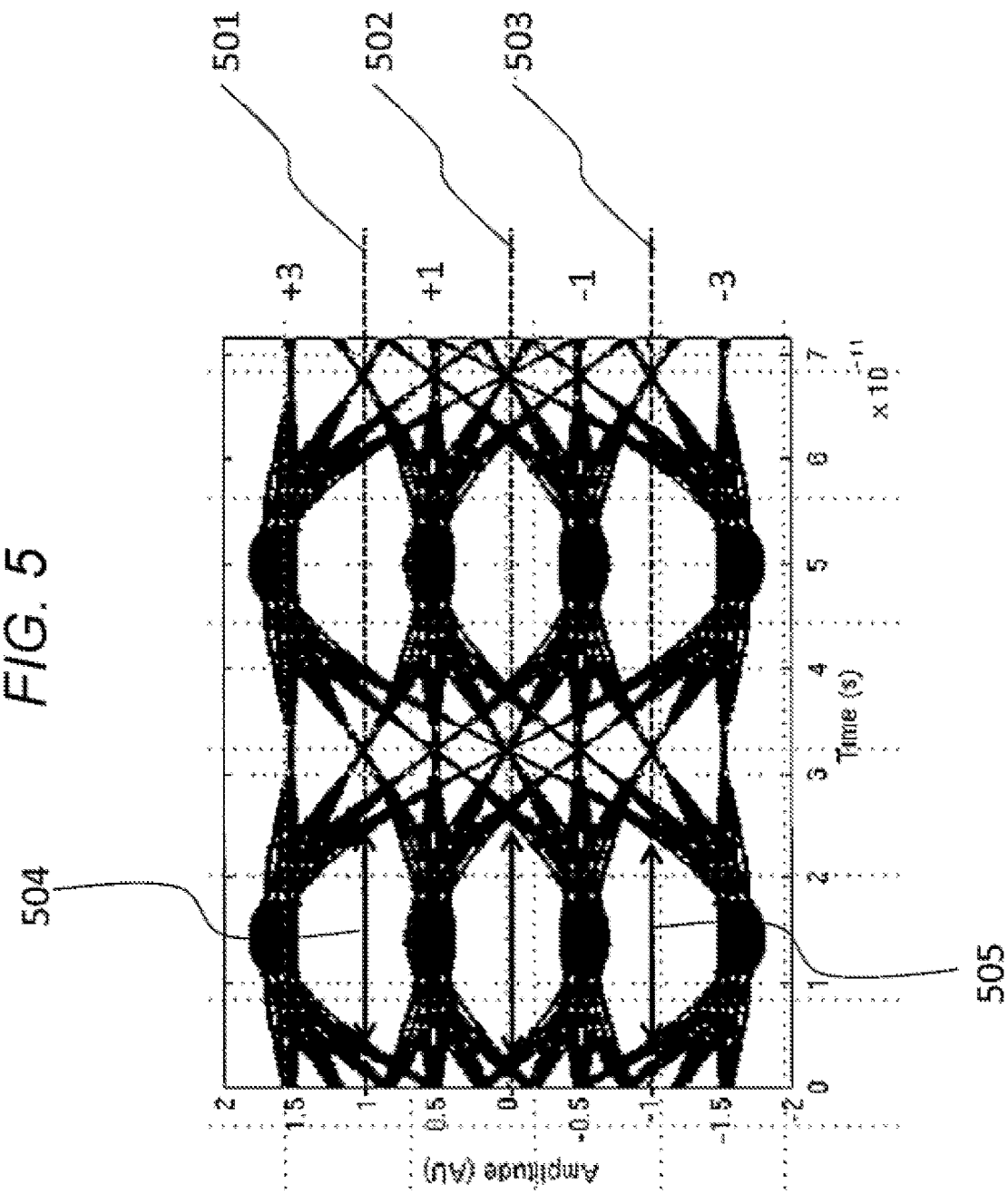
FIG. 5 is a diagram illustrating waveforms of a PAM-4 signal passed through a raised cosine filter.

FIG. 5 illustrates an EYE waveform of a signal obtained after passing a 56 Gbps PAM-4 signal through a raised cosine filter with a bandwidth of 22 GHz and a roll-off of 0.5. In FIG. 5, when the signal has a value higher than a determination threshold 501, the signal is determined to be +3, when the signal has a value between the determination threshold 501 and a determination threshold 502, the signal is determined to be +1, when the signal has a value between the determination threshold 502 and a determination threshold 503, the signal is determined to be −1, and when the signal has a value lower than the determination threshold 503, the signal is determined to be −3. Ranges above the determination thresholds 501, 502, and 503 through which the signal does not pass is referred to as the EYE widths. As seen in FIG. 5, the EYE width is defined by the upper EYE width 505 and the lower the EYE width 506, and the EYE widths 505 and 506 are defined by the data transition time, −3→+3 and +3→−3. The EYE width is narrowed by approximately 15 ps even under the condition that the bandwidth is limited by a frequency higher than the Nyquist frequency and there is almost no influence of ISI. In this manner, the EYE width of the PAM multilevel signal is narrowed relative to that of the NRZ signal due to data pattern dependence.

We propose a method of correcting data by detecting a data pattern which tends to be incorrectly transitioned from received data and correcting the detected data pattern to correct the data, considering that it can be predicted how transmitted data will be incorrectly transitioned depending on a pattern.

Figure 6:
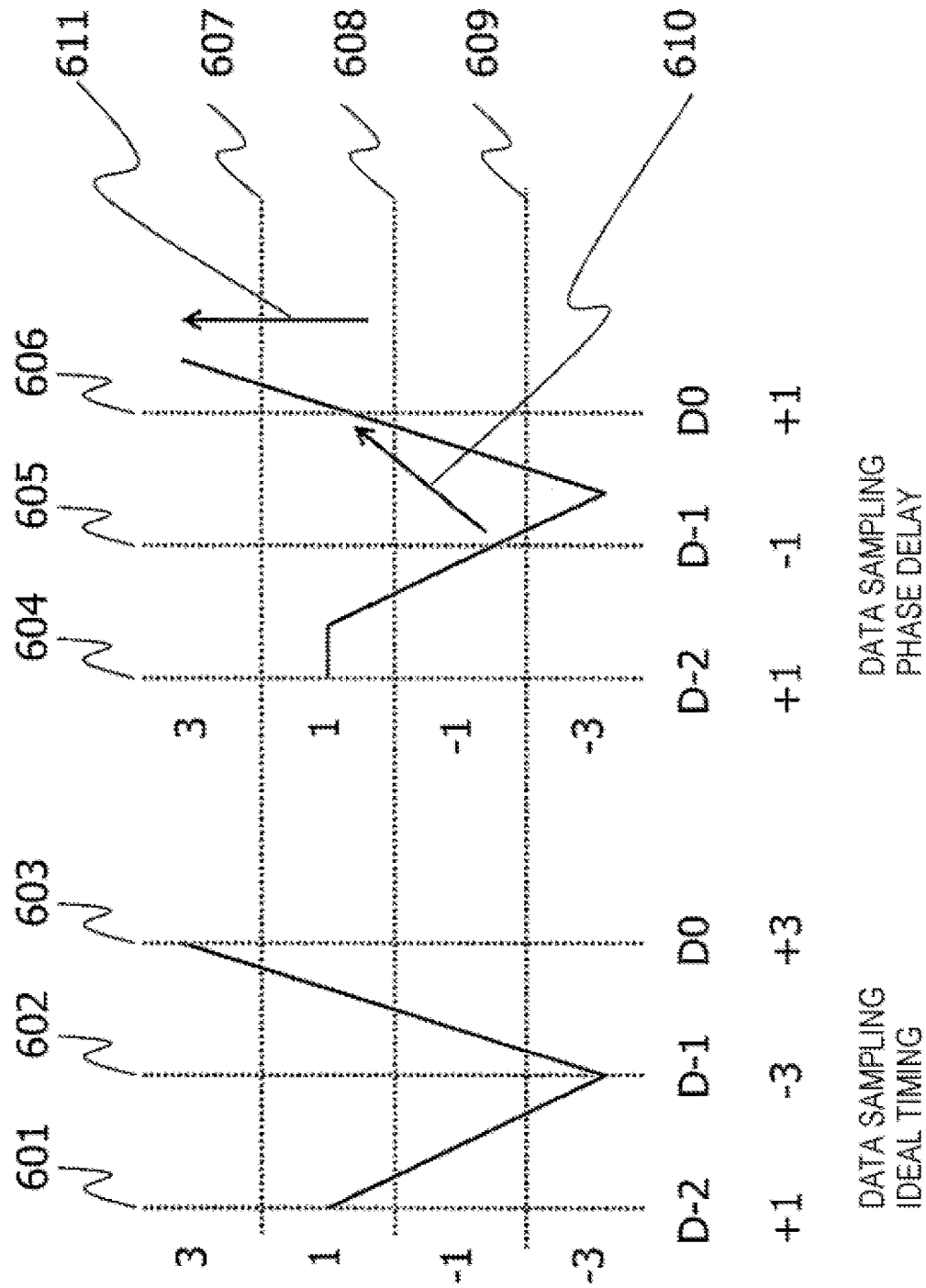
FIG. 6 is a graph illustrating a state of a data error where a data sampling clock phase is delayed.

FIG. 6 illustrates an example of PAM-4 where a phase is delayed. In this example, data is determined to be +3 when the data has a value above a threshold 607, +1 when the data has a value between a threshold 608 and the threshold 607, −1 when the data has a value between a threshold 609 and the threshold 608, and −3 when the data has a value below the threshold 609. In ideal data sampling timing, it is determined that data is +1 at the second data sampling timing 601 before current data sampling timing 603, −3 at the previous data sampling timing 602 to the current data sampling timing 603, and +3 at the current data sampling timing 603. However, when the phase of the data sampling is delayed, a value at a phase advanced by the amount equal to the phase delay is sampled. Therefore, the data is determined to be +1 at the second data sampling timing 604 before the current data sampling timing 603, and −1 at the previous data sampling timing 605, and +1 at the current data sampling timing 606, and at the data sampling timing 603 and the data sampling timing 606, the data is incorrectly transitioned +3→+1. However, application of correction 611 with the same polarity as that of a value changing direction 610 enables correction to the original data. When the phase of a data pattern to be detected is delayed, the data pattern changes due to the influence of the previous data, so basically it is sufficient to detect data to be corrected and some previous data sequences.

Figure 7:
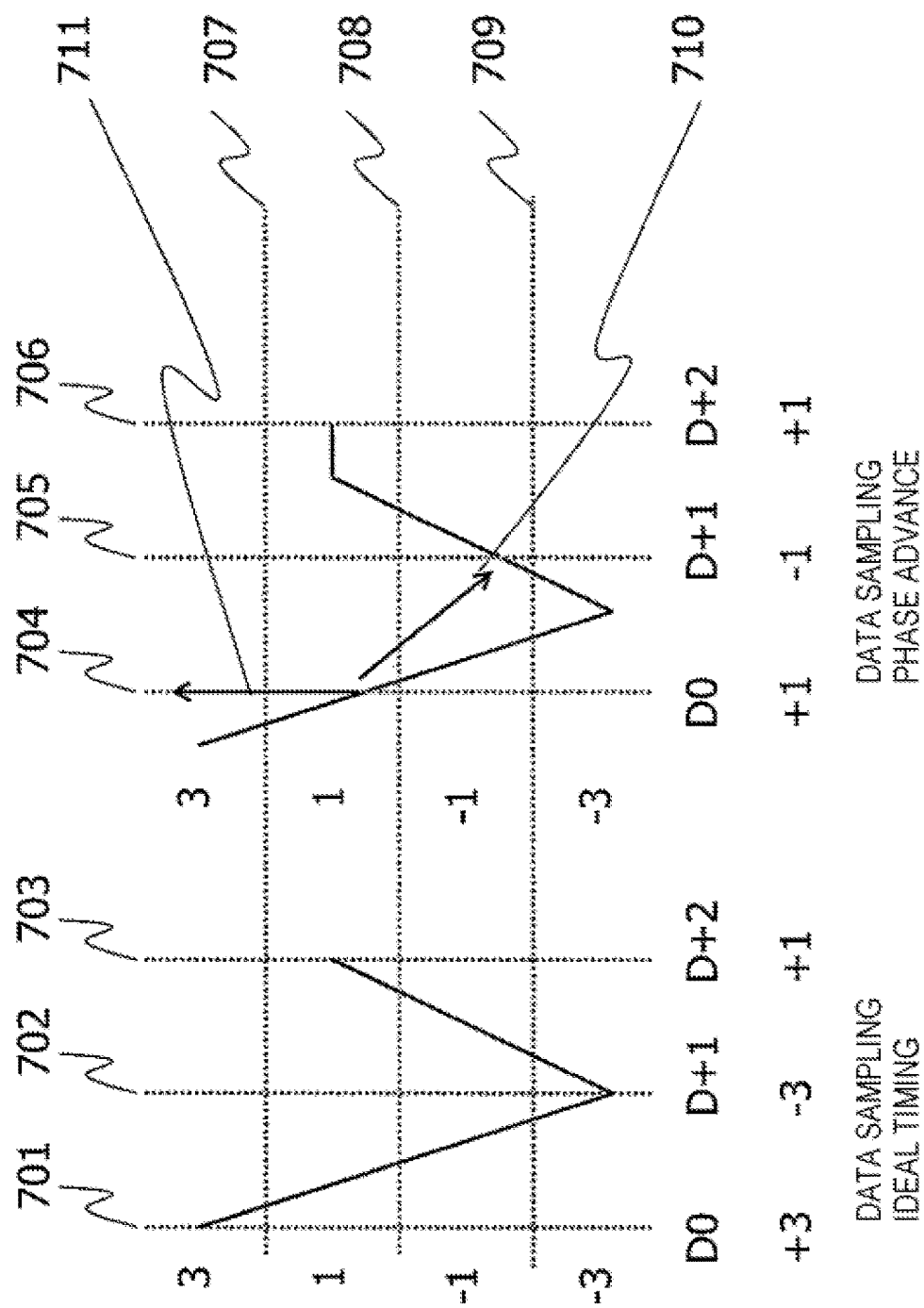
FIG. 7 is a graph illustrating a state of a data error where a data sampling clock phase advances.

FIG. 7 illustrates an example of PAM-4 where a phase advances. In this example, data is determined to be +3 when the data has a value above a threshold 707, +1 when the data has a value between a threshold 708 and the threshold 707, −1 when the data has a value between a threshold 709 and the threshold 708, and −3 when the data has a value below the threshold 709. In ideal data sampling timing, it is determined that the data is +3 at current data sampling timing 701, −3 at the subsequent data sampling timing 702 to the current data sampling timing 701, and +3 at the second data sampling timing 703 after the current data sampling timing 701. However, when the phase of data sampling advances, a value at a phase delayed by the amount equal to the phase advance is sampled. Therefore, the data is determined to be +1 at the current data sampling timing 704, and −1 at the subsequent data sampling timing 705, and +1 at the second data sampling timing 706 after the current data sampling timing 704, and at the data sampling timing 701 and the data sampling timing 703, the data is incorrectly transitioned +3→+1. However, application of correction 711 with the opposite polarity to that of a value change direction 710 enables correction to the original data. In FIG. 7, since the polarity of the correction is opposite to that in the phase delay of FIG. 6, it is necessary to detect the advance and the delay of the phase. In addition, when the phase of a data pattern to be detected advances, the data pattern changes due to the influence of the subsequent data, so basically it is sufficient to detect data to be corrected and some subsequent data sequences.

First Embodiment

Figure 8:
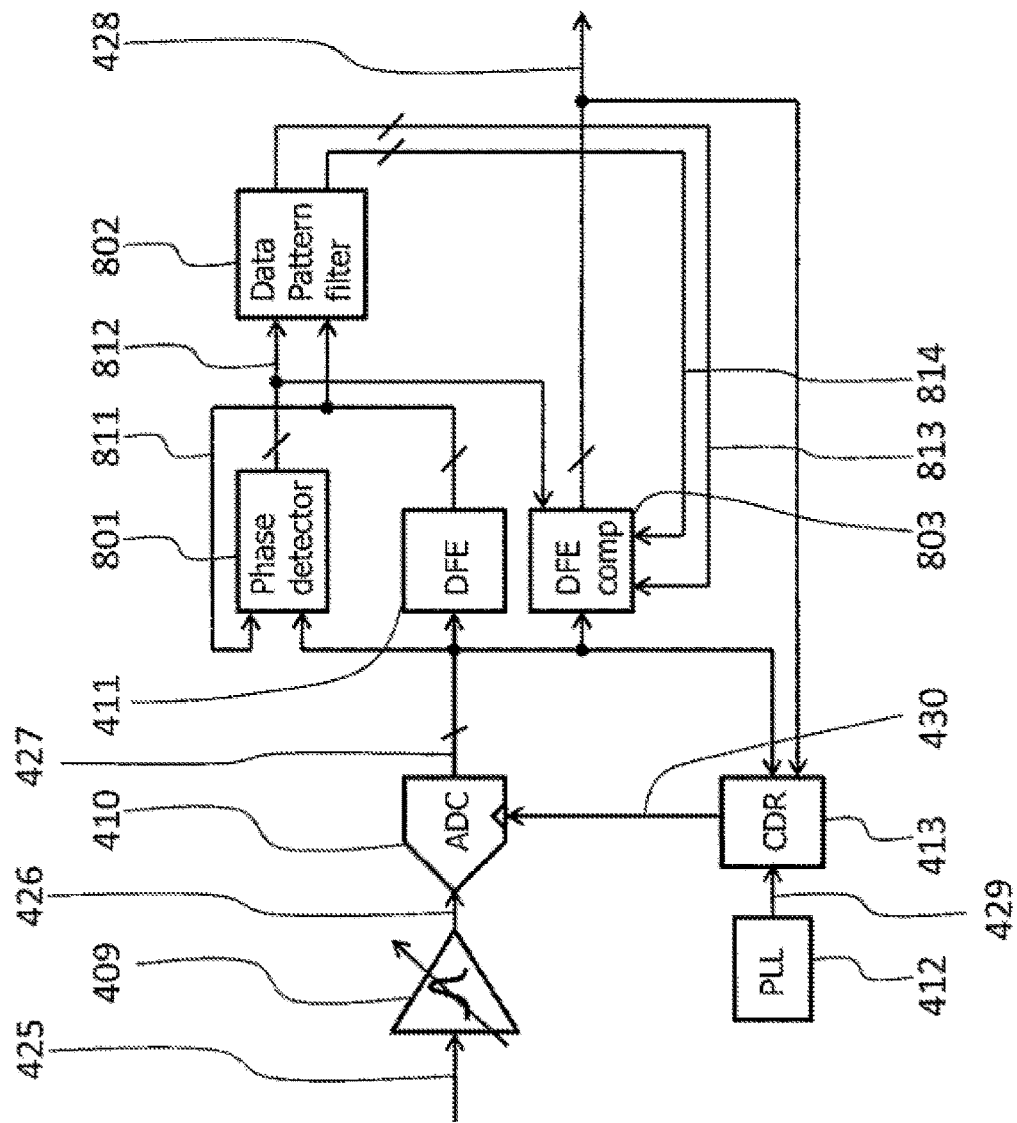
FIG. 8 is a diagram illustrating a receiver according to a first embodiment of the present invention.

To achieve the above description, FIG. 8 illustrates a configuration according to a first embodiment. To the receiver 405 of FIG. 4, a phase detector 801, a data pattern filter 802, and a DFE 803 with correction are added. The phase detector 801 receives input of the output data 427 from the ADC 410 and output data 811 from the DFE 411, detects whether the phase advances or delays, and outputs a phase detection result 812. The data pattern filter 802 receives the input of the phase detection result 812 from the phase detector 801 and the output data 811 from the DFE 411, compares a data pattern sequence to be corrected and the output data 811, and outputs either phase-advance correction data 813 or phase-delay correction data 814 according to the phase detection result 812, when the data pattern sequence to be corrected and the output data 811 match. When the phase of the phase detection result 812 is detected to advance, the phase-delay correction data 814 becomes 0, when the phase of the phase detection result 812 is detected to lags, the phase-advance correction data 813 becomes 0, and when the phase detection result 812 shows that the phase of the phase does not advance or lag, both the phase-advance correction data 813 and the phase-delay correction data 814 become 0. In the DFE 803 with correction, the output data 427 from the ADC 410, the phase detection result 812 from the phase detector 801, the phase-advance correction data 813, and the phase-delay correction data 814 are input, the correction data 813 and the correction data 814 are added to the ADC output data 427 for determination, and the receiver output data 428 is corrected and output. For example, when the PAM-4 is used, data is determined to be −3, −1, +1, or +3, and when a PAM-8 is used, data is determined to be −7, −5, −3, −1, +1, +3, 5, or +7.

Figure 9:
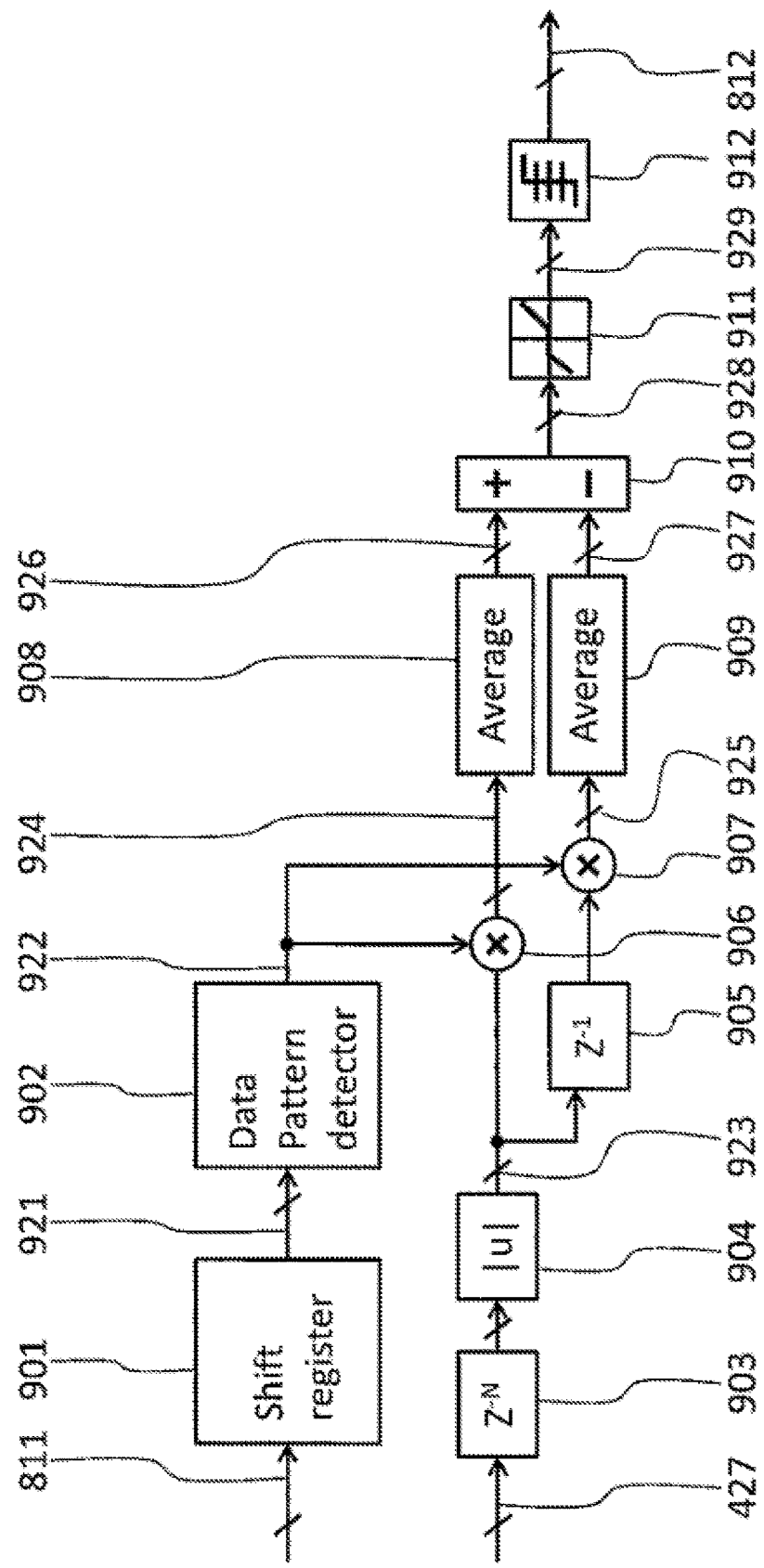
FIG. 9 is a diagram illustrating a phase comparator according to the first embodiment.

FIG. 9 illustrates an example of the phase detector 801. A shift register 901 receives the input of the DFE output data 811 and generates a delayed data sequence 921. The data sequence 921 is input to a data pattern detector 902. The data pattern detector 902 detects a data pattern (for example, −1, −1, +1, +1) with a reducing ISI, sets a data pattern detection result 922 to high when the input data sequence 921 and the data pattern match, and outputs the data pattern detection result 922 as low when the delayed data sequence 921 and the data pattern do not match. A delay difference between the ADC output data 427 and a path passing through the shift register 901 and the data pattern detector 902 is adjusted by an N-clock delay line 903, converted into an absolute value by an absolute value converter 904, and becomes amplitude data 923. The amplitude data 923 and data obtained by delaying the amplitude data 923 by a 1-clock delay line 905 are multiplied by the data pattern detection result 922 in a multiplier 906 and a multiplier 907, respectively. The data pattern detection result 922 operates as an enable signal, and sets input data to 0 when the data pattern detection result 922 is not high. A moving averager 908 performs moving average on phase-advance-side amplitude data 924 which is an output from the multiplier 906, and the phase-advance-side amplitude data 924 becomes phase-advance-side average amplitude data 926. Similarly, a moving averager 909 performs moving average on phase-delay-side amplitude data 925 which is an output from the multiplier 907, and the phase-delay-side amplitude data 925 becomes phase-delay-side average amplitude data 927. Ranges of the number of data sets for performing the moving average of the moving averager 908 and the moving averager 909 have a fixed amount, and an averaging range may be adjusted by register setting or the like. The subtractor 910 subtracts the phase-delay average amplitude data 927 from the phase-advance-side average amplitude data 926, and outputs an amplitude difference 928. The amplitude difference 928 is input to a dead zone 911, and an amplitude below a threshold is converted to 0. The threshold of the dead zone 911 is settable by a register or the like. A phase advance degree 929, which is an output from the dead zone 911, is input to a multi-value determiner 912, and the phase advance degree 929 is determined. It is determined whether the input 929 is at least positive or negative, or 0. When the phase detection result 812 is positive, the phase is detected to advance, and when the phase detection result 812 is negative, the phase is detected to be delayed.

Figure 10:
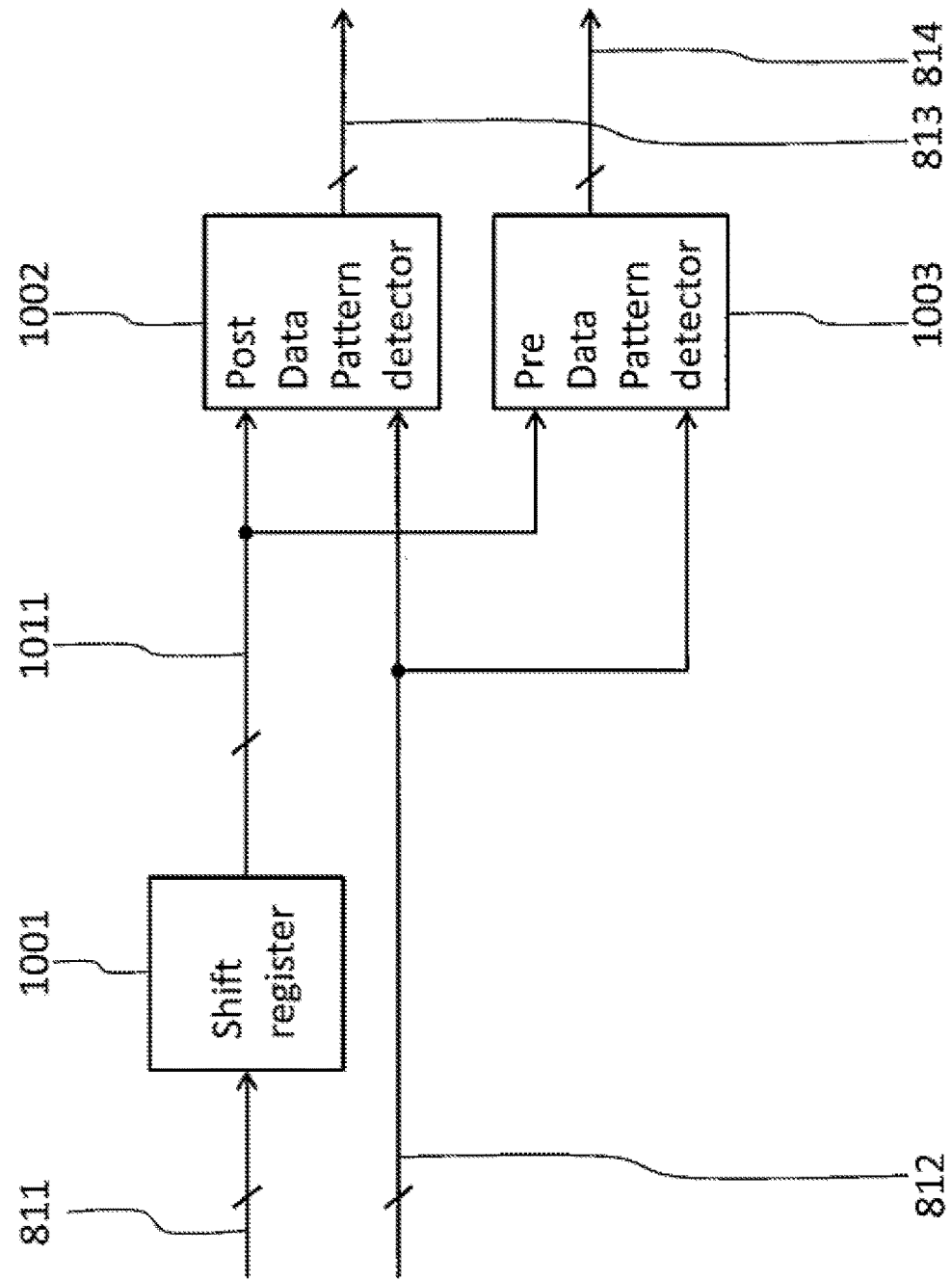
FIG. 10 is a diagram illustrating a data pattern filter according to the first embodiment.

FIG. 10 illustrates an example of the data pattern filter 802. The shift register 1001 delays the output data 811 from the DFE 411 and outputs a data sequence 1011. The data sequence 1011 requires a data sequence including at least five data sets. The data sequence 1011 is input to a phase-delay data pattern detector 1003 and a phase-advance data pattern detector 1002, when the phase detection result 812 to be input is likewisely positive, only the phase-advance data pattern detector 1002 operates, and when the phase detection result 812 Is negative, only the phase-delay data pattern detector 1003 operates. Although the phase-advance data pattern detector 1002 and the phase-delay data pattern detector 1003 have different correction values to be output to an input data pattern, the operation principle is the same, and when an input matches a preset data pattern, a corresponding correction value is output. The phase-advance data pattern detector 1002 and the phase-delay data pattern detector 1003 each contain a lookup table, and store a correction value corresponding to an input data sequence. The correction value can be changed by changing a register value by using a program, or can be changed by using automatic convergence. The phase-advance correction data 813 is output from the phase-advance data pattern detector 1002 and the phase-delay correction data 814 is output from the phase-delay data pattern detector 1003.

Figure 11:
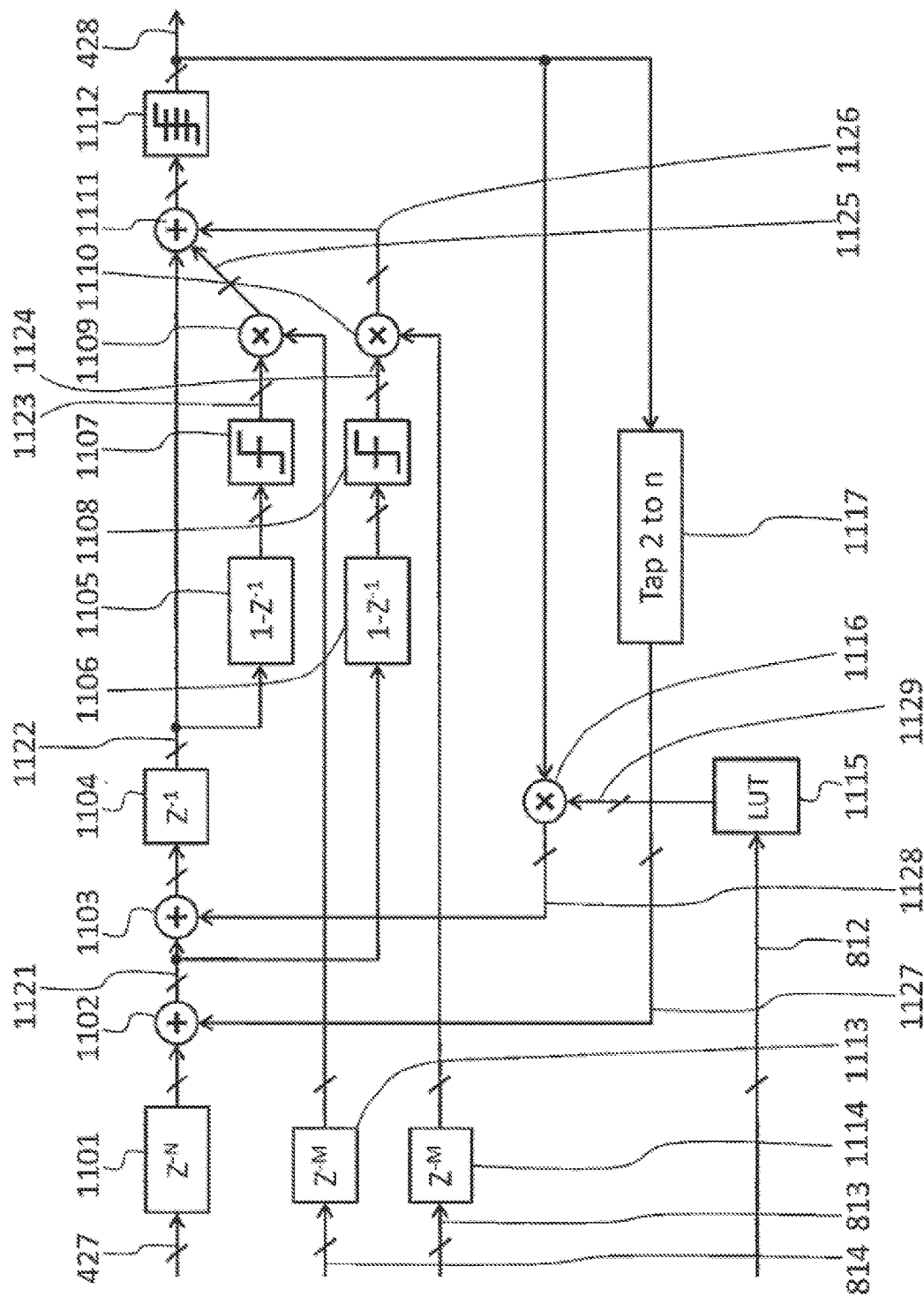
FIG. 11 is a diagram illustrating a DFE with correction according to the first embodiment.

FIG. 11 illustrates an example of the DFE 803 with correction. A delay amount of the ADC output data 427 is adjusted by an N-clock delay line 1101, an adder 1102 applies a filter tap 1127 including tap-2 and subsequent taps to the ADC output data 427, and the adder 1102 outputs a higher-order tap addition result 1121. The higher-order tap addition result 1121 and tap-1 data 1128 are input to an adder 1103 and added to each other, and delayed by a 1-clock delay line 1104, and then the 1-clock delay line 1104 outputs a DFE filter output 1122. The DFE filter output 1122 is input to a differentiator 1105, the differentiator 1105 calculates an amount of change relating to the DFE filter output 1122, and a determiner 1107 receives input of the amount of change and determines a data transition polarity 1123 in phase delay. A multiplier 1109 receives the data transition polarity 1123 in phase delay and phase-delay correction data 814 delay-adjusted by an M-clock delay line 1113, multiplies the data transition polarity 1123 and the phase-delay correction data 814, and outputs a correction value 1125 in phase delay. The higher-order tap addition result 1121 is input to a differentiator 1106, the differentiator 1106 calculates an amount of change relating to the higher-order tap addition result 1121, a determiner 1108 determines the amount of change and outputs a data transition polarity 1124 in phase advance. A multiplier 1110 receives the data transition polarity 1124 in phase advance and phase-advance correction data 813 delay-adjusted by an M-clock delay line 1114, multiplies the data transition polarity 1124 and the phase-advance correction data 813, and outputs a correction value 1126 in phase advance. The DFE filter output 1122, the correction value 1125 in phase delay, and the correction value 1126 in phase advance are input to an adder 1111 and added to each other to calculate a corrected signal, and a multi-value determiner 1112 determines the corrected signal and outputs the receiver output data 428. For example, the multi-value determiner 1112 determines data as four values of −3, −1, +1, and +3 when PAM-4 is used, and determines data as eight values when PAM-8 is used. The receiver output data 428 is fed back and multiplied by a filter coefficient, and added to the input. A high order tap filter 1117 receives input of the receiver output data 428, delays the receiver output data 428 internally and multiplies the receiver output data 428 by a tap coefficient, and outputs an output 1127 from a higher-order tap filter, that is, tap-2 to Tap-n. For tap-1, tap-1 coefficient data 1129 is output depending on the phase detection result 812 from a lookup table 1115 to which the phase detection result 812 is input. The multiplier 1116 receives input of the receiver output data 428 and the tap-1 coefficient data 1129, multiplies the receiver output data 428 and the tap-1 coefficient data 1129, and outputs the tap-1 data 1128. Then, the tap-1 data 1128 is added to an input.

Figure 12:
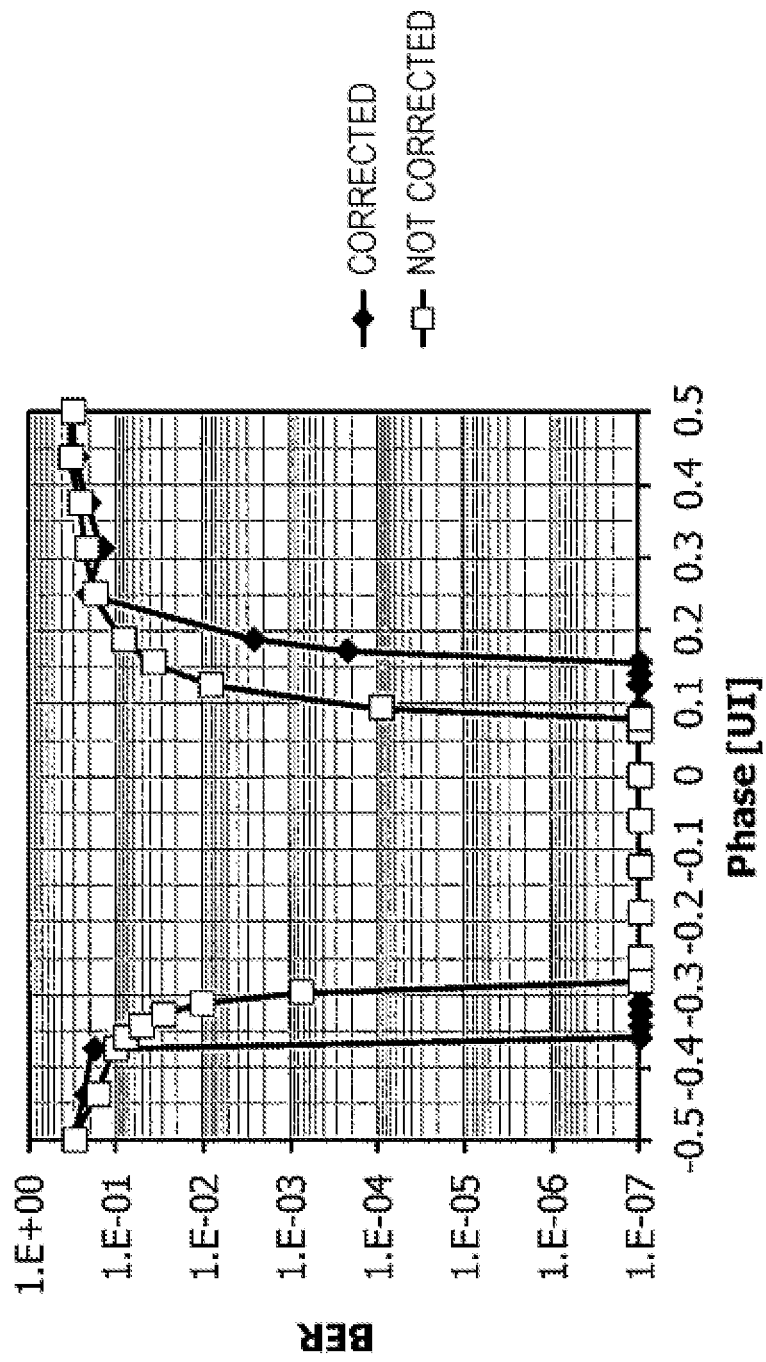
FIG. 12 is a graph illustrating an effect according to the present invention.

FIG. 12 illustrates bathtub curves showing bit error rates (BER) representing effects of using the present invention. A BER using the present invention (corrected) and a BER not using the present invention (not corrected). In the example of FIG. 12, an EYE width which is error free is improved by 0.15 UI, effectively improving the EYE width.

Second Embodiment

When there is a bit error in the DFE, the influences of the errors, the number of which is equal to the number of taps of the DFE, disadvantageously remain. For this reason, in the DFE that is not corrected in the first embodiment, the influences remain, and there is a possibility that all the data to be compared with the data pattern filter may be data with errors, and there is a possibility of erroneous correction.

Therefore, in the second embodiment, a higher-order tap of the DFE inputs corrected data so as not to transfer an error as much as possible. Therefore, correction is also applied to an unnecessary data pattern to prevent correct data from being converted to wrong data.

Figure 13:
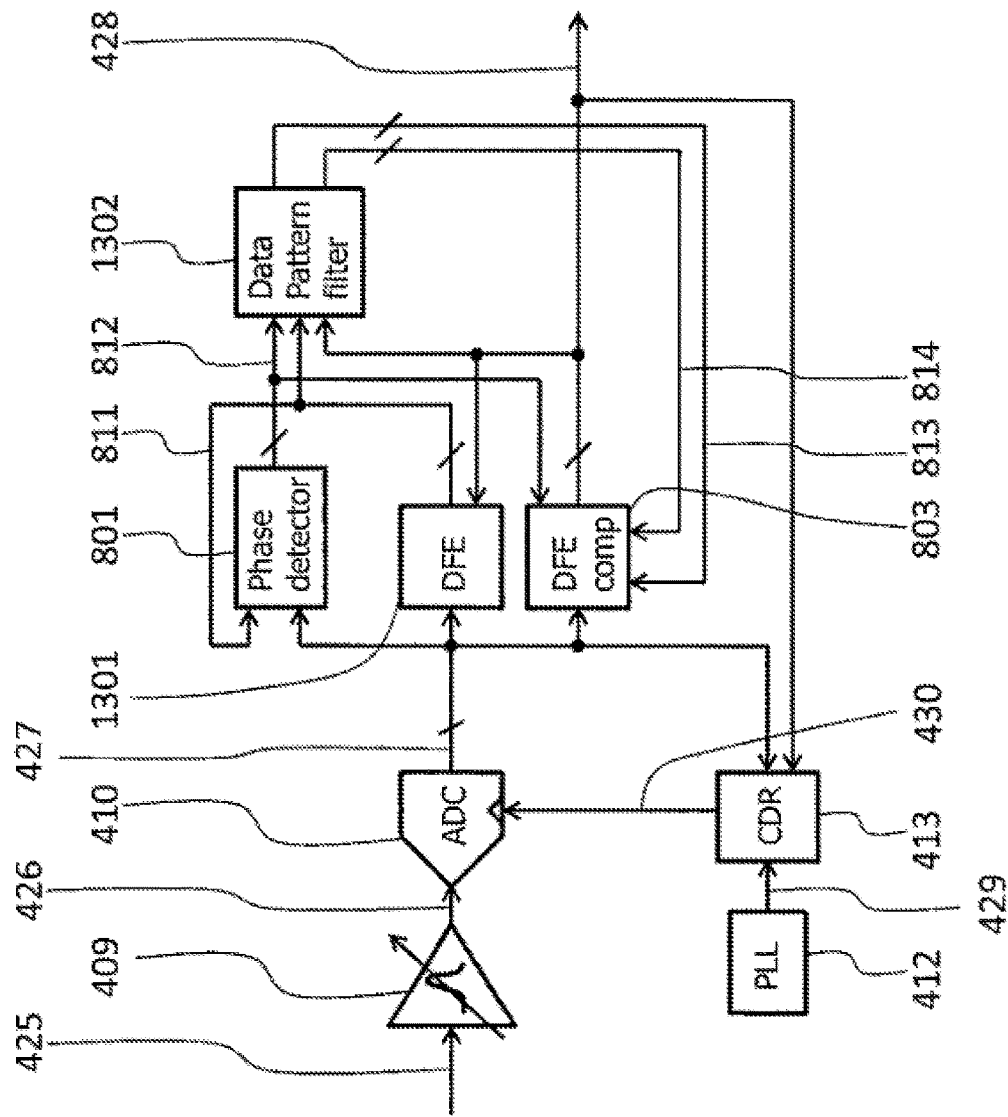
FIG. 13 is a diagram illustrating a receiver according to a second embodiment.

FIG. 13 illustrates the second embodiment. An output 428 from the DFE 803 with correction is input to a DFE 1301, and replace the output 428 with data that is fed back in the DFE 1301. The output 428 from the DFE 803 with correction is also input to a data pattern filter 1302, and the data is partially changed to corrected data.

Figure 14:
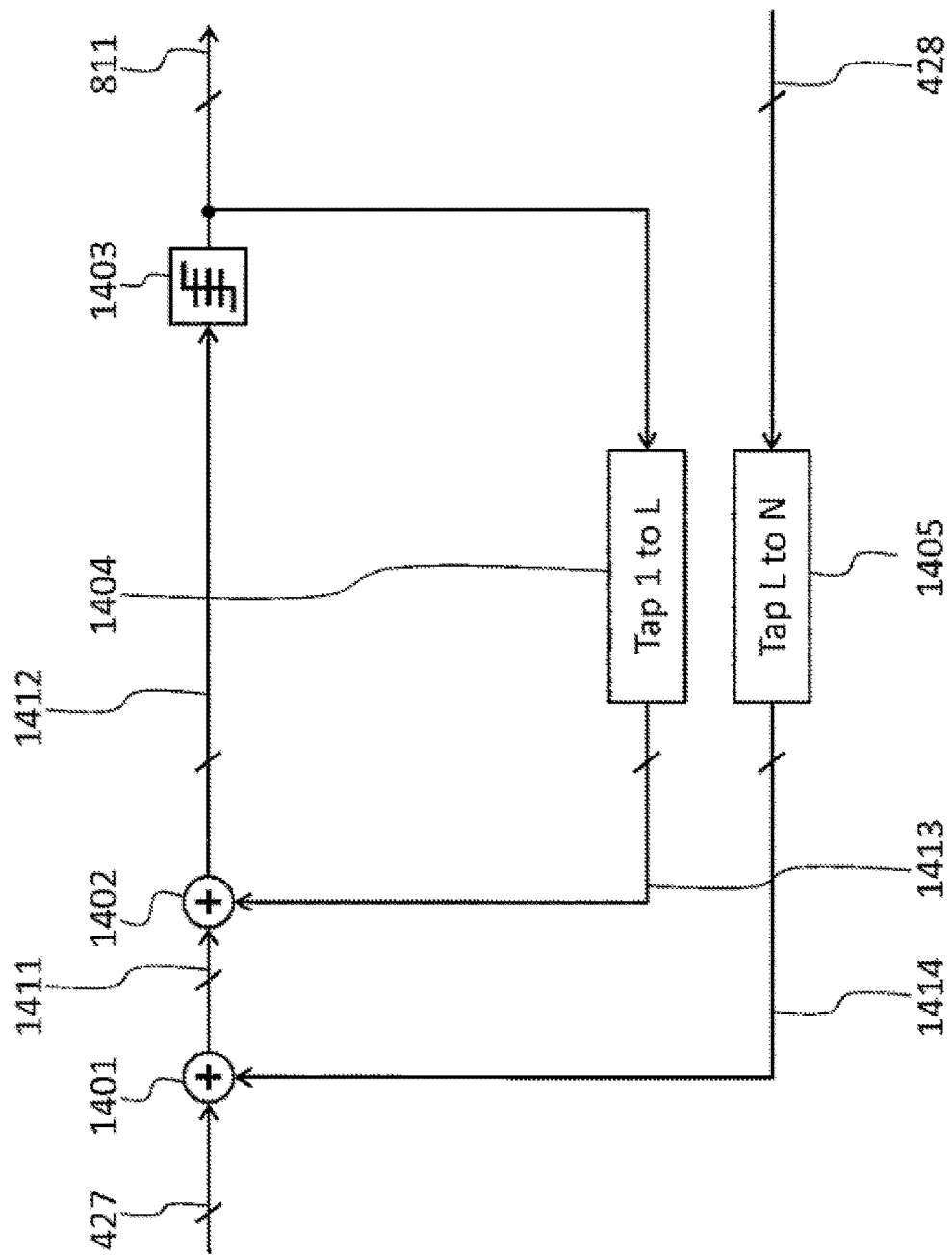
FIG. 14 is a diagram illustrating a DFE according to a second embodiment.

FIG. 14 illustrates an example of the DFE 1301. In FIG. 14, it is assumed that an N-tap DFE and the data pattern filter 1302 filter data to be corrected by using L previous data patterns. In the DFE 1301, ADC output 427 is input, and the ADC output data 427 is added to a higher-order tap signal 1414 obtained by delaying an output 428 from the DFE with correction and multiplying the output 428 by a tap coefficient in a higher-order tap block 1405, in the adder 1401. An output 1411 from the adder 1401 is added to a lower-order tap signal obtained by delaying a DFE output 811 and multiplying the DFE output 811 by a tap coefficient in the adder 1402, in a lower-order tap block 1404. An output 1412 from the adder 1402 is determined by a decision unit 1403. A PAM-4 signal is determined as four values, and a PAM-8 signal is determined as eight values.

Figure 15:
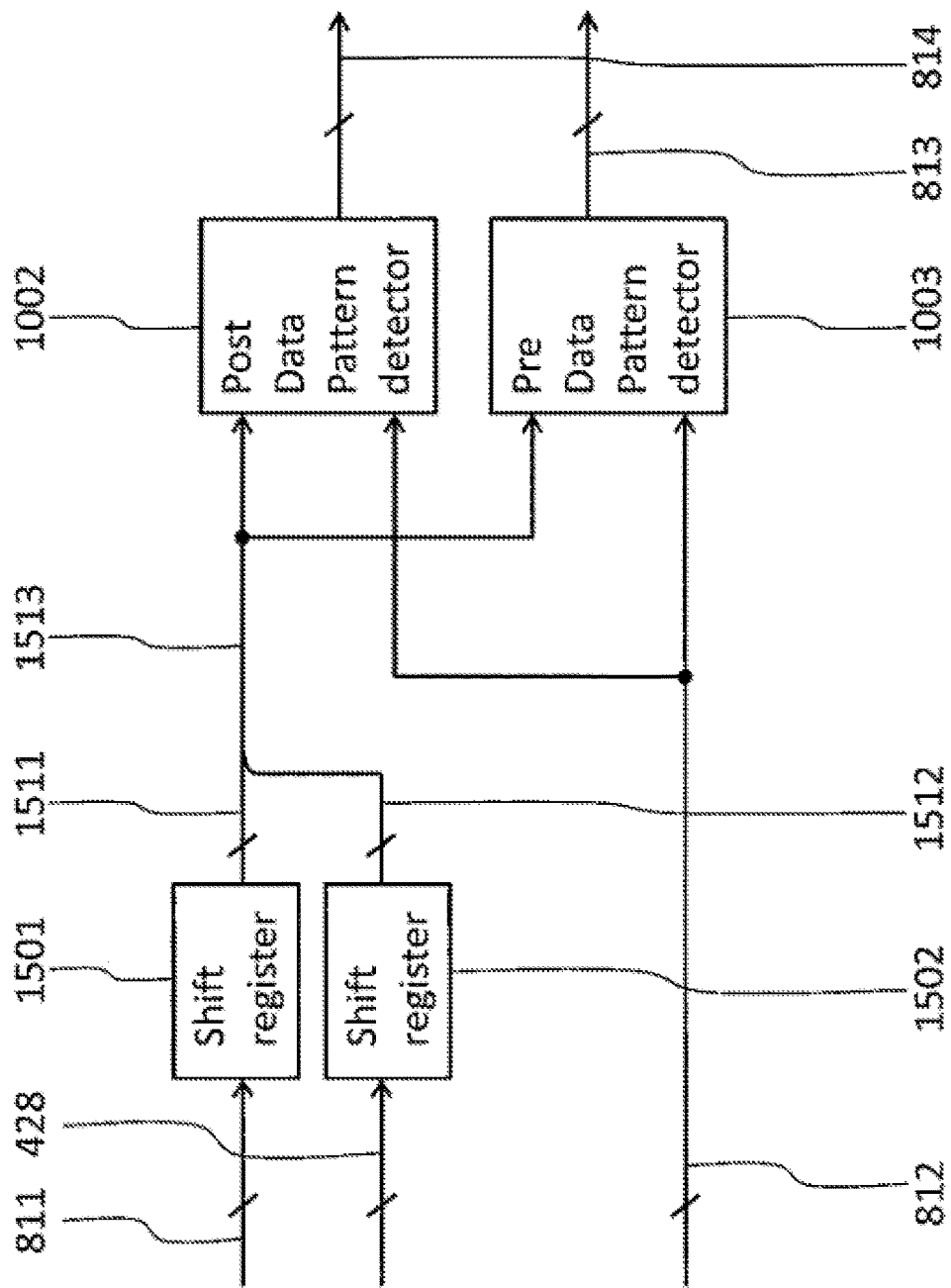
FIG. 15 is a diagram illustrating a data pattern filter according to the second embodiment.

FIG. 15 illustrates an example of the data pattern filter 1302. The data pattern filter 1302 includes two shift registers for generating delayed data sequences, data with less delay uses a delayed DFE output 811, and data with more delay uses a delayed output 428 from the DFE with correction. A shift register 1501 receives input of a DFE output 811 and outputs a maximum of L delayed data sequences 1511. Here, the number L is the same as the number L in FIG. 14. The shift register 1502 receives input of the output 428 from the DFE with correction, and outputs a delayed data sequence 1512. The delayed data sequences 1511 and the delayed data sequence 1512 are collected into one bus line and become a delayed data sequence 1513. The delayed data sequence 1513 is input to the phase-advance data pattern detector 1002 and the phase-delay data pattern detector 1003, and whether the delayed data sequence 1513 and a data pattern match is detected.

Third Embodiment

Figure 16:
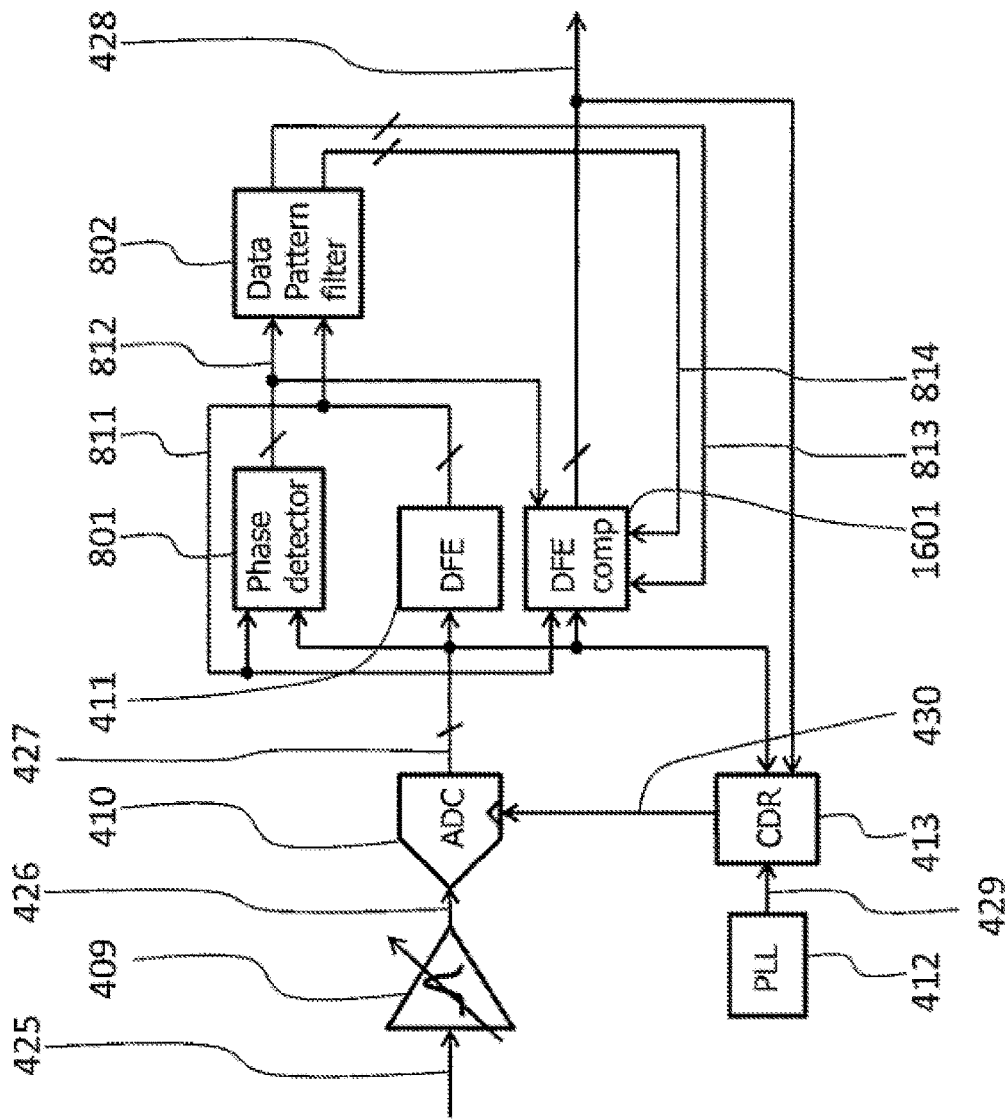
FIG. 16 is a diagram illustrating a configuration of a receiver according to a third embodiment.

As a third embodiment, FIG. 16 illustrates a receiver in which an output 811 from the DFE 411 is added to a DFE 1601 with correction. In FIG. 16, a value calculated from the DFE output 811 is compared with a value of an ADC output 427, and when a difference between the values is small, correction is not applied. In the embodiments described above, since it is expected that correction is necessary from a wrong data sequence and correction is made, there is a possibility of applying a correction and causing a mistake even if data is not wrong. Therefore, when a difference between a value calculated from the DFE output 811 and the ADC output 427 is small, no correction is applied assuming that no data error is made, thereby making it possible to suppress the correction more than necessary.

Figure 17:
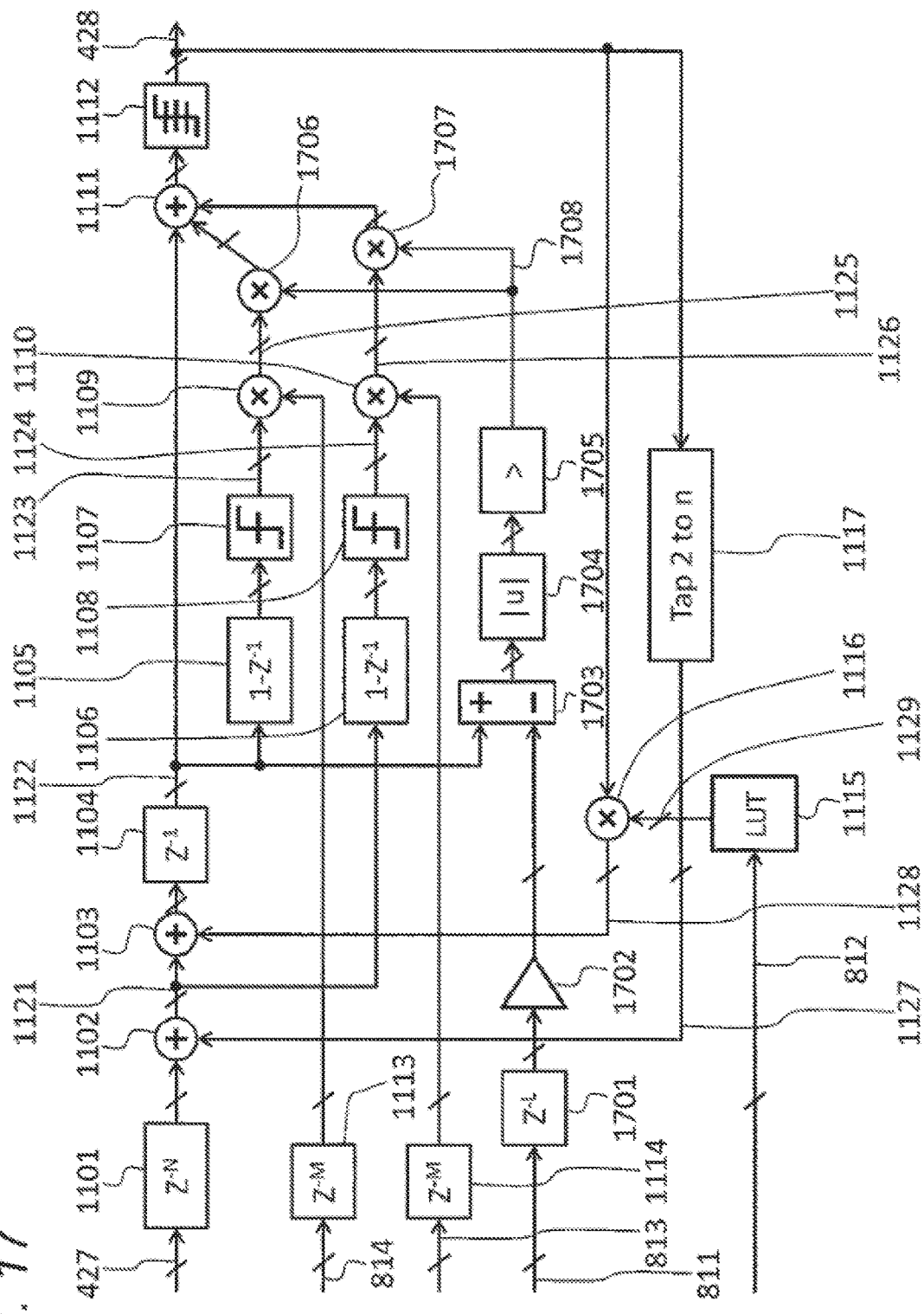
FIG. 17 is a diagram illustrating a configuration of a DFE with correction according to the third embodiment.

FIG. 17 illustrates an example of the DFE 1601 with correction at that time. The DFE 1601 is basically the same as the DFE 803 with correction in FIG. 11, and a correction control circuit is added. The correction control circuit has the following configuration. A DFE output 811 is delay-adjusted by a delay line 1701 and multiplied by amplitude data corresponding to data determined by an amplitude converter 1702. a subtractor 1703 obtains a difference between the DFE output 811 and a DFE filter result 1122, converted into an absolute value by an absolute value converter 1704, compared with a threshold set by a comparator or the like by a comparator 1705, and converted to a correction control signal 1708. The correction control signal 1708 less than the threshold represents 0, and the correction control signal 1708 more than the threshold represents 1. The correction control signal 1708 is multiplied by a correction value 1125 in phase delay in a multiplier 1706, and the correction control signal 1708 is multiplied by a correction value 1126 in a multiplier 1707. Each correction control signal 1708 is added to the DFE filter result 1122 in the adder 1111. That is, when a difference between the DFE filter result 1122 and the DFE output 811 which is returned to data before the determination is small, it is determined that no data error occurs, and the correction value is set to 0 so that no correction is applied.

REFERENCE SIGNS LIST 101 internal board
102 semiconductor integrated device for signal processing
103 semiconductor integrated device for communication
104 connector
201 internal board
202 internal transmission line
203 internal board
204 semiconductor integrated device for signal processing
205 repeater
206 repeater
207 semiconductor integrated device for communication
208 connector
209 connector
210 connector
301 internal board
302 internal transmission line
303 internal board
304 connector
305 connector
401 semiconductor integrated device
402 transmission line
303 semiconductor integrated device
404 transmitter
405 receiver
406 signal processing unit
407 multiplexer
408 PLL (Phase Locked Loop)
409 FFE (Feed Forward Equalizer)
410 CTLE (Continuous Linear Equalizer)
411 ADC (Analog to Digital Converter)
412 DFE (Decision Feedback Equalizer)
413 PLL (Phase Locked Loop)
414 CDR (Clock and Data Recovery)
415 signal processing unit
421 transmission signal parallel data
422 transmitter clock
423 transmission signal serial data
424 output from transmitter
425 input to receiver
426 CTLE output signal
427 ADC output data
428 receiver output data
429 output clock from receiver PLL
430 receiver clock
501 determination threshold
502 determination threshold
503 determination threshold
504 upper EYE width
505 lower EYE width
601 data sampling timing two clocks before current data sampling timing when there is no timing difference
602 data sampling timing one clock before current data sampling timing when there is no timing difference
603 data sampling timing without timing difference
604 data sampling timing two clocks before current data sampling timing when there is clock phase delay
605 data sampling timing one clock before current data sampling timing when there is clock phase delay
606 data sampling timing when there is clock phase delay
607 +3/+1 data determination threshold
608 +1/−1 data determination threshold
609 −1/−3 data determination threshold
610 received-data transition direction
611 correction direction
701 data sampling timing two clocks before current data sampling timing when there is no timing difference
702 data sampling timing one clock before current data sampling timing when there is no timing difference
703 data sampling timing without timing difference
704 data sampling timing two clocks before current data sampling timing when there is clock phase advance
705 data sampling timing one clock before current data sampling timing when there is clock phase advance
706 data sampling timing when there is clock phase advance
707 +3/+1 data determination threshold
708 +1/−1 data determination threshold
709 −1/−3 data determination threshold
710 received-data transition direction
711 correction direction
801 phase detector
802 data pattern filter
803 DFE with correction
811 DFE output data
812 phase detection result
813 phase-advance correction data
814 phase-delay correction data
901 shift register
902 data pattern filter
903 N-clock delay line
904 absolute value converter
905 1-clock delay line
906 multiplier
907 multiplier
908 moving averager
909 moving averager
910 subtractor
911 dead zone 912 multi-value determiner
921 delayed data sequence
922 data pattern detection result
923 amplitude data
924 phase-advance-side amplitude data
925 phase-delay-side amplitude data
926 phase-advance-side average amplitude data
927 phase-delay-side average amplitude data
928 amplitude difference
929 phase advance degree
1001 shift register
1002 phase-advance data pattern detector
1003 phase-delay data pattern detector
1011 delayed data sequence
1101 N-clock data delay line
1102 adder
1103 adder
1104 1-clock delay line
1105 differentiator
1106 differentiator
1107 0/1 determiner
1108 0/1 determiner
1109 multiplier
1110 multiplier
1111 adder
1112 multi-value determiner
1113 M-clock data delay line
1114 M-clock data delay line
1115 lookup table
1116 multiplier
1117 higher-order tap filter
1121 higher-order tap addition result
1122 DFE filter result
1123 data transition polarity in phase delay
1124 data transition polarity in phase advance
1125 correction value when there is phase delay
1126 correction value in phase advance
1127 output from higher-order tap filter
1128 tap-1 data
1129 tap-1 coefficient data
1301 DFE for correction data input
1302 data pattern filter using correction data
1401 adder
1402 adder
1403 multi-value determiner
1404 low-order tap filter
1405 higher-order tap filter
1411 higher-order tap addition result
1412 DFE filter result
1413 output from low-order tap filter
1414 output from higher-order tap filter
1501 shift register
1502 shift register
1511 delayed data sequence
1512 delayed data sequence after correction
1513 delayed data sequence to which corrected data is added
1601 DFE with correction
1701 delay line
1702 amplitude converter
1703 subtractor
1704 absolute value converter
1705 comparator
1706 multiplier
1707 multiplier
1708 correction control signal

The invention claimed is:

1. A receiver for multi-level pulse modulation comprising:
a linear equalizer which amplifies and equalizes a received signal;
an analog-to-digital converter which converts an output from the linear equalizer into a digital value;
a phase detector which detects whether a phase of a clock for a received signal advances or delays on the basis of an output from the analog-to-digital converter and an output of a decision feedback equalizer which filters the output from the analog-to-digital converter;
a decision feedback equalizer with correction which filters and corrects the output from the analog-to-digital converter; and
a data pattern filter which determines a phase and a data pattern on the basis of an output from the phase detector and an output from the decision feedback equalizer, and gives a correction amount to the decision feedback equalizer with correction,
wherein the decision feedback equalizer with correction corrects received data to reduce errors,
wherein the decision feedback equalizer with correction generates delay data obtained by adding a delay of adjustment to data receiving input of an output from the analog-to-digital converter by using a delay line, detects a transition polarity from data to be corrected to data one clock after the data to be corrected when phase advance is detected by the phase detector by using the delay data, detects a transition polarity from previous data to data to be corrected to the data to be corrected when a phase detected by the phase detector delays, and multiplies a correction value received from the data pattern filter by the transition polarity and adds the correction value to the delay data.

2. The receiver for multi-level pulse modulation according to claim 1, further comprising: a shift register which delays an output from the decision feedback equalizer to generate a delayed data sequence; and a phase-advance data pattern detector and a phase-delay data pattern detector to which an output from the shift register and an output from the phase detector are input, respectively, wherein the phase-advance data pattern detector includes a lookup table and outputs a correction value assigned to an output data sequence from the shift register when phase advance is detected from an output from the phase detector, and the phase-delay data pattern detector includes a lookup table and outputs a correction value assigned to an output data sequence from the shift register when phase delay is detected from an output from the phase detector.

3. A receiver for multi-level pulse modulation comprising:
a linear equalizer which amplifies and equalizes a received signal;
an analog-to-digital converter which converts an output from the linear equalizer into a digital value;
a phase detector which detects whether a phase of a clock for a received signal advances or delays on the basis of an output from the analog-to-digital converter and an output of a decision feedback equalizer which filters the output from the analog-to-digital converter;
a decision feedback equalizer with correction which filters and corrects the output from the analog-to-digital converter; and
a data pattern filter which determines a phase and a data pattern on the basis of an output from the phase detector and an output from the decision feedback equalizer, and gives a correction amount to the decision feedback equalizer with correction, wherein the decision feedback equalizer with correction corrects received data to reduce errors, wherein an output from the decision feedback equalizer with correction is input to the decision feedback equalizer and the data pattern filter, part of feedback data in the decision feedback equalizer is replaced with an output from the decision feedback equalizer with correction to eliminate influence of a data error for a long time in the decision feedback equalizer, part of a determination data sequence of the data pattern filter is replaced with an output from the decision feedback equalizer with correction to generate data in which an error is suppressed, subsequent to data of an output from the decision feedback equalizer with correction, and unnecessary correction is prevented in the decision feedback equalizer with correction to improve accuracy in correction.

4. The receiver for multi-level pulse modulation according to claim 3, further comprising: a shift register which delays an output from the decision feedback equalizer to generate a delayed data sequence; a shift register which delays an output from the decision feedback equalizer with correction to generate a delayed data sequence; and a phase-advance data pattern detector and a phase-delay data pattern detector to which a corrected data sequence obtained by connecting an output from the shift register delaying an output from the decision feedback equalizer and an output from the shift register delaying an output from the decision feedback equalizer with correction, and an output from the phase detector is input, wherein the phase-advance data pattern detector outputs a correction value assigned to the corrected data sequence when phase advance is detected from an output from the phase detector, and the phase-delay data pattern detector outputs a correction value assigned to the corrected data sequence when phase delay is detected from an output from the phase detector.

5. The receiver for multi-level pulse modulation according to claim 1, further comprising: a converter which receives an output from the decision feedback equalizer, adjusts delay in output from the decision feedback equalizer, and converts the output to a value before determination; and a comparator which calculates a difference between an output from the converter and a value before determination in the decision feedback equalizer with correction, and controls a correction value to set a correction value in the decision feedback equalizer with correction to 0 when the difference is smaller than a threshold.

* * * * *